US006654920B1

(12) United States Patent
Hetherington et al.

(10) Patent No.: US 6,654,920 B1
(45) Date of Patent: Nov. 25, 2003

(54) LBIST CONTROLLER CIRCUITS, SYSTEMS, AND METHODS WITH AUTOMATED MAXIMUM SCAN CHANNEL LENGTH

(75) Inventors: Graham G. Hetherington, Sharnbrook (GB); Anthony Fryars, Dustin Northampton (GB)

(73) Assignee: Texas Instruments Incorporated, Dallas, TX (US)

(*) Notice: Subject to any disclaimer, the term of this patent is extended or adjusted under 35 U.S.C. 154(b) by 465 days.

(21) Appl. No.: 09/696,326

(22) Filed: Oct. 25, 2000

Related U.S. Application Data
(60) Provisional application No. 60/172,845, filed on Dec. 20, 1999.

(51) Int. Cl.[7] ............................................. G01R 31/28
(52) U.S. Cl. ...................................... 714/733; 324/73.1
(58) Field of Search .............................. 714/726–729, 714/731–733, 738–739, 30, 724; 708/254, 255, 270; 377/29; 365/240, 78–77, 54; 324/73.1, 537, 763; 716/7

(56) References Cited

U.S. PATENT DOCUMENTS 4,283,620 A * 8/1981 Drescher et al. ............... 377/29
6,442,723 B1 * 8/2002 Koprowski et al. .......... 714/732

OTHER PUBLICATIONS

Rajski et al. "Comparative study of CA–based PRPGs and LFSRs with phase shifters; Mentor Graphics Corp., Wilsonwille, OR 17th IEEE VLSI Test Symposium, 1999. PRoceedings; Pp: 236–245; Apr. 29, 1999".*

Kemnitz "Synthesis of locally exhaustive test pattern generators; VLSI Test Symposium, 1995. Proceedings., 13th IEEE , Pp. 440–445; 30 Apr.–May 30, 1995".*

* cited by examiner

Primary Examiner—Albert Decady
Assistant Examiner—Guy Lamarre
(74) Attorney, Agent, or Firm—Tammy L. Williams; W. James Brady, III; Frederick J. Telecky, Jr.

(57) ABSTRACT

An integrated circuit (10) comprising combinational circuitry (13). The integrated circuit further comprises a plurality of scan channels (SC1 through SC4). Each of the plurality of scan channels comprises a number of scan elements ($EC1_1$ through $EC4_5$). For any of the plurality of scan channels having a number of scan elements greater than one element, the scan channel comprises a first element in the scan channel and a last element in the scan channel. For any of the plurality of scan channels having a number of scan elements equal to one element, the one element is both a first element and a last element in the scan channel. Further, selected ones of the scan elements are coupled to affect operation of the combinational circuitry. The integrated circuit further comprises circuitry (24) for coupling a predetermined pattern into the first element of each of the plurality of scan channels and circuitry (26) for detecting the predetermined pattern in the last element of each of the plurality scan channels. Finally, the integrated circuit further comprises circuitry (22, 23) for determining, in response to circuitry for detecting, the number of scan elements in a longest of the plurality of scan channels.

23 Claims, 2 Drawing Sheets

LBIST CONTROLLER CIRCUITS, SYSTEMS, AND METHODS WITH AUTOMATED MAXIMUM SCAN CHANNEL LENGTH

This application claims priority under 35 U.S.C. § 119 (e)(1) of provisional application No. 60/172,845 filed Dec. 20 1999.

CROSS-REFERENCES TO RELATED APPLICATIONS

Not Applicable.

STATEMENT REGARDING FEDERALLY SPONSORED RESEARCH OR DEVELOPMENT

Not Applicable.

BACKGROUND OF THE INVENTION

The present embodiments relate to built-in-self-testing for integrated circuits and are more particularly directed to a testing controller that is readily adaptable to various different integrated circuit designs.

The complexity of modern integrated circuit applications has greatly increased the need for thoroughly testing these devices once they are constructed. Typically, such testing is performed at the beginning of the life cycle of the device, and provided the device successfully meets the testing criteria, it is then shipped for eventual use in an application. To facilitate this testing, testing circuitry is often included on the integrated circuit and the use of such circuitry is commonly referred to as a built-in-self-test ("BIST"). As further explored later, BIST circuitry often includes numerous storage registers connected to one another to form what is referred to in the art as a scan chain, where each register in the chain is commonly implemented as a flip-flop. To perform a test, test patterns are written into the scan chain registers and the state of the integrated circuit is determined to evaluate whether the state properly reflects the appropriate operation of the integrated circuit given the test patterns. Further in this regard, prior to the advent of BIST systems scan chains as described above were used for testing through use of a tester, external from the integrated circuit, to generate the various test patterns that were then scanned into the scan chain(s) of the integrated circuit for testing. More recently, however, BIST has been developed whereby many contemporary integrated circuits include on-chip BIST controllers which themselves generate the test patterns, thereby considerably reducing the need for an off-chip tester. BIST also has various related technologies, such as logic BIST (or "LBIST") for testing combinational logic or memory BIST for testing memory circuits.

By way of further background, yet another more recent feature in the field of LBIST systems has been the addition to LBIST of an architecture which is referred to in the art by its acronym STUMPS, thereby abbreviating the terms "self-test using MISR/parallel SRSG," where MISR is an abbreviation for multiple input signature register and SRSG is an abbreviation for shift register sequence generator. As further explored later, a STUMPS architecture includes various different scan paths referred to as "channels," where each channel is again formed using multiple interconnected storage registers, such as flip-flops. In a scan mode, an LBIST controller loads the multiple channels with respective test patterns, and the device is then switched into its functional mode and operated for one or more clock cycles, thereby changing the state at likely many of the nodes of the circuit. The state changes include changes that will affect what is stored in one or more of the scan channel registers. Thereafter, the device is returned to the scan mode, and the data in the scan channels are shifted out and evaluated to determine if the expected result are produced, thereby either confirming proper device operation or evidencing a problem with the device. In addition to evaluating the scan channel data, other device states and signals may be evaluated (such as via integrated circuit output pins) to determine if the device operated properly in response to the test.

While the STUMPS architecture has provided considerable advancement in BIST and LBIST effectiveness, the present inventors have recognized that it includes a considerable drawback. Specifically, further arising in connection with the multiple scan channels in a STUMPS architecture is the fact that the channels commonly have a different number of scan registers (or "cells"). In the art, it is said that these number of cells form the length of each scan channel and, thus, applying this terminology to the preceding then it may be stated that the scan channels are of different lengths. In any event, given this aspect the length of the longest scan channel must be known to the LBIST controller so that it may properly load the channels with scan test patterns and properly control the LBIST testing once the test patterns are loaded. In the prior art and to accommodate this requirement, the length of the longest scan channel is hard coded into the LBIST controller at the time the controller is designed and formed. However, as with other aspects of circuit design, when a value is hard coded into an integrated circuit, it restricts the flexibility of the circuit as related to that value. For example, an LBIST controller once formed and hard coded in this manner is restricted for use with a STUMPS architecture having a longest scan channel equal to the hard coded value. As another example, if the length of the longest scan channel is changed during development of the integrated circuit, then attention also must be properly made to ensure that the planned hard coded value is also changed so as to achieve proper operation of the LBIST controller.

Given the preceding, the present inventors set forth below a preferred embodiment for LBIST STUMPS architectures, and which seeks to address, reduce, and potentially eliminate the drawbacks set forth above.

BRIEF SUMMARY OF THE INVENTION

In a preferred embodiment, there is an integrated circuit comprising combinational circuitry. The integrated circuit further comprises a plurality of scan channels. Each of the plurality of scan channels comprises a number of scan elements. For any of the plurality of scan channels having a number of scan elements greater than one element, the scan channel comprises a first element in the scan channel and a last element in the scan channel. For any of the plurality of scan channels having a number of scan elements equal to one element, the one element is both a first element and a last element in the scan channel. Further, selected ones of the scan elements are coupled to affect operation of the combinational circuitry. The integrated circuit further comprises circuitry for coupling a predetermined pattern into the first element of each of the plurality of scan channels and circuitry for detecting the predetermined pattern in the last element of each of the plurality of scan channels. Finally, the integrated circuit further comprises circuitry for determining, in response to circuitry for detecting, the number of scan elements in a longest of the plurality of scan channels. Other circuits, systems, and methods are also disclosed and claimed.

DETAILED DESCRIPTION OF THE INVENTION

Figure 1:
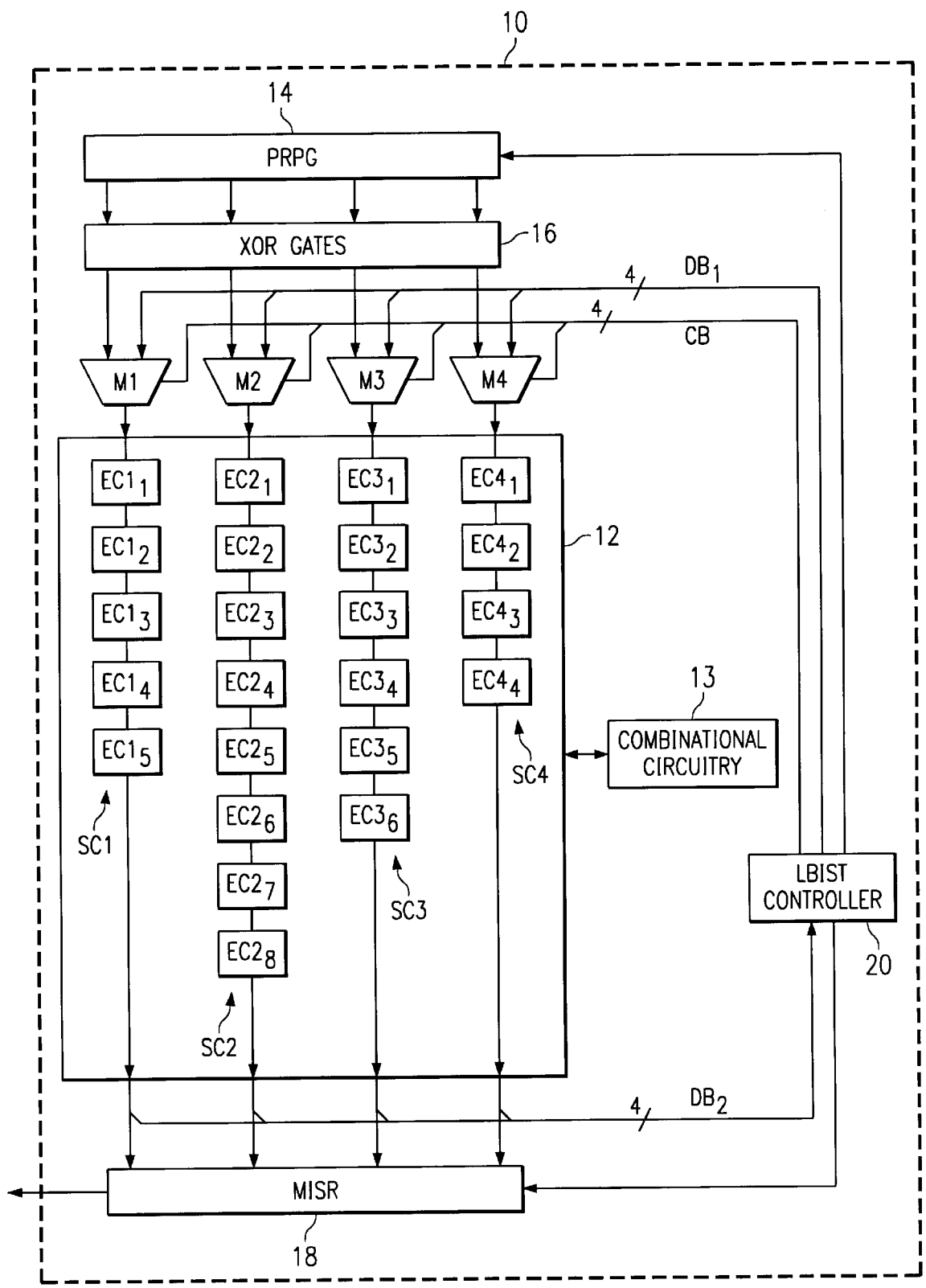
FIG. 1 illustrates an electrical diagram of an integrated circuit as 10 having a scan core 12 with a number of scan channels.

FIG. 1 illustrates an integrated circuit product designated generally as 10. In the referred embodiment, integrated circuit product 10 may be one of various types of circuits, such as a microprocessor, an application specific integrated circuit ("ASIC"), a digital signal processor ("DSP"), or other device where it is desirable to have LBIST capability using a STUMPS or comparable architecture. Note that integrated circuit product 10 may include numerous circuits, connections, and signals which are not shown so as to simplify the present discussion. Instead, integrated circuit product 10 illustrates only sufficient detail to demonstrate the concept of LBIST operations in contrast to all typical operations. In any event, some of what is shown in FIG. 1 is known in the LBIST art, but is further improved as discussed below.

Integrated circuit 10 includes a scan core 12 which is known in the art. Scan core 12 includes a number of scan channels designated generally with the abbreviation "SC" (for "scan channel"). Further, by way of example, scan core 12 includes four such scan channels. To distinguish these scan channels from one another for the remaining discussion, each is identified by combining a number with the SC abbreviation; for example, a first scan channel is shown as SC1, a second scan channel is shown as SC2, and so forth. Each scan channel includes a number of registers or storage elements that, as mentioned earlier, are typically flip-flops, where the output of one flip flop in a channel is connected to the input of a next successive flip flop in the channel. For purposes of discussion, each storage element in FIG. 1 is identified with the abbreviation "E" (for element), and following the abbreviation is the channel abbreviation identifying the scan channel to which the element belongs. For example, each element shown as EC1 is an element in scan channel SC1, each element EC2 is an element in scan channel SC2, and so forth. Further, for each scan channel, the elements include a subscript identifying the order of the element along its channel, and also thereby identifying the total number of elements in a channel by examining the subscript for the last element in a channel. For example, in scan channel SC1, it includes elements $EC1_1$ through $EC1_5$, thereby indicating that scan channel SC1 includes a total of five (from the subscript "5" in $EC1_5$) elements. Further in this regard, note that it is often the case that the scan channels will not all have the same number of storage elements. By way of example, therefore, in scan core 12 scan channel SC1 has five storage elements, scan channel SC2 has eight storage elements, scan channel SC3 has six storage elements, and scan channel SC4 has four storage elements. Note these numbers of elements are only by way of example, where in actuality the numbers of storage elements in a scan channel may range from one to several hundred.

Before proceeding, note that to simplify the illustration of FIG 1 the scan channel elements are not explicitly shown to connect to other circuitry. However, the use of these elements is well known for purposes of testing such other circuitry, where various different elements are connected to various different nodes or operational circuits for purposes of testing. To illustrate this connection and relationship in a simplified manner, integrated circuit 10 is shown to include a combinational logic block 13 connected only generally to scan core 12, with it understood that various scan channel elements may be connected in various fashions to block 13 so that when integrated circuit 10 is in a functional mode the states stored by of one or more of the elements may affect circuitry within block 13, and such circuitry may affect the states stored by one or more of the elements. Combinational logic block 13 includes combinational logic as suggested by its name, and also may include other types of circuits which are tested in combination with scan core 12. In any event, and as further appreciated later, in a scan mode each scan channel operates as a shift register, whereby a bit loaded into a first element in a scan channel is shifted to a next successive element in the channel, and so forth for the remaining elements per channel so that a different test bit may be located in each scan channel. Next, integrated circuit 10 is switched into a functional mode and operated for one or more clock cycles. During this time, the combination of the scan channel elements and block 13 operates as functional circuitry. Further, the functional mode operation changes the state at likely many of the nodes of combination logic block 13. The state changes include changes that will affect what is stored in one or more of the scan channel elements. Thereafter, integrated circuit 10 is returned to the scan mode, and the data in the scan channels are shifted out and evaluated to determine if the expected results are produced, thereby either confirming proper device operation or evidencing a problem with the functional circuitry (i.e., scan core 12 and combinational logic block 13) of integrated circuit 10. In addition to evaluating the scan channel data, other device states and signals may be evaluated (such as via integrated circuit output pins) to determine if integrated circuit 10 operated properly in response to the test.

Before proceeding, note that the scan channel elements of FIG. 1 are described above as ordinary flip flops only by way of example. Thus, also contemplated within the present inventive scope are other types of scan channel elements, where the elements have in common the formation of scan chains as described above. For example, another type of scan channel element as known in the art is a multiplexer scan flip flop, where the storage device consists of a flip flop preceded by a multiplexer. As another example, another type of scan channel element as known in the art is a clocked scanned flip flop, where the flip flop operates in response to two different clocks, one being a scan clock for clocking data into the flip flop and another being a functional clock for operating the flip flop during the functional mode of operation. As a final example of a scan channel element as known in the art and which may be implemented using the present inventive teachings, there is an LSSD (level sensitive scan design) configuration which consists of two latches per element, whereby the latches operate in response to a master clock, a test clock, and a slave clock. Still other examples may be ascertained by one skilled in the art.

Turning now to additional aspects of integrated circuit 10 as known in the art, it further includes additional BIST-related circuits, which by way of one embodiment are shown as a psuedo random pattern generator ("PRPG") block 14, an XOR gates block 16, and a multiple input signature register ("MISR") block 18. In alternative embodiments, however, each of these blocks may be replaced by other BIST-accomplishing circuits. In any event, each of blocks 14, 16, and 18 is controlled by an LBIST controller 20, where as detailed later, LBIST controller 20 not only includes circuitry and methodology to control these devices according to the prior art, but further operates in a preferred inventive manner as well. To further present the similarities and differences of integrated circuit 10 with the prior art, below is first a discussion of blocks 14, 16, and 18 in the prior art respect, followed by the remaining discussion in which the inventive preferred embodiment is explored in detail.

LBIST controller 20 provides one or more seeds to PRPG block 14 and PRPG block 14 in response outputs parallel streams of pseudo random sequences of bits. Ultimately, the bits output by PRPG block 14 translate to the bits used in the scan channels of scan core 12. More particularly, these bit sequences are output by PRPG block 14 to XOR gates block 16 which further manipulates these bits, and then provides them to the scan channels of scan core 12 as detailed below.

XOR gates block 16 is included to remove some of the correlation between adjacent bit streams from PRPG block 14. Specifically, if adjacent streams of bits from PRPG block 14 were examined, one skilled in the art could identify a considerable level of correlation between the streams notwithstanding the pseudo random operation of PRPG block 14. Accordingly, XOR gates block 16 de-correlates these streams using a group of XOR gates (sometimes referred to in the art as a cloud of XOR gates or as a phase shifter). XOR gates block 16 also often involves an operation of shifting the bit streams a number of shifts which exceeds the maximum length of the scan channels in scan core 12. Finally, it is noted that XOR gates block 16 also is operable to permit a level of fan out if the number of scan channels exceeds the number of outputs provided by PRPG block 14. In any event, the outputs of XOR gates block 16 are coupled to the inputs of the scan channels in scan core 12 (via multiplexers discussed later).

MISR block 18 provides an additional level of efficiency for processing the output of the scan channels. First, recall from the earlier discussion that the outputs of the scan channels are examined to determine whether the device (here, integrated circuit 10) operated properly given an input scan test. Further in this regard, MISR block 18 compresses the data it receives as outputs from each of the scan channels. More particularly, the compression methodology generates what is referred to as a "signature" representative of the data output from the scan channels. This output is illustrated in FIG. 1 as generally being available external to integrated circuit 10, and in this manner the illustration is intended to depict that the signatures may then be examined to determine the outcome of the test. Further in this regard, recall that FIG. 1 is simplified in various respects so as not to illustrate other circuits and the like which could be included in integrated circuit 10. One such other circuit may relate to a different type of scan testing, often referred to in the art as boundary scan testing, and which also may involve an IEEE 1149.1 boundary scan controller. This aspect is mentioned here because the signatures output by MISR block 18 may be used in connection with such testing and such a boundary scan controller.

The discussion now turns to the remaining aspects illustrated in FIG. 1 with respect to integrated circuit 10, where those aspects relate to the inventive preferred embodiment and will be shown to cooperate in certain respects with the items already discussed. These additional aspects relate to the paths for data input and output to scan core 12, and further to the operation (and circuitry to accomplish such operation) of LBIST controller 20. Each of these aspects is described below.

With respect to the data input to scan core 12, a set of multiplexers, each identified in part with the abbreviation "M", is coupled between the outputs of XOR gates block 16 and respective inputs to the scan channels; thus, for each output of XOR gates block 16 and each input to a scan channel, there is a corresponding multiplexer having an input connected to receive data from XOR gates block 16 and an output connected to a scan channel input. For the sake of reference, each multiplexer identifier also is followed by a number that is the same as the number identifier used by its corresponding scan channel. For example, multiplexer M1 corresponds to scan channel SC1, multiplexer M2 corresponds to scan channel SC2, and so forth. In addition to the connections described thus far, each multiplexer M1 through M4 has a second input coupled to a receive data from a bus $DB_1$, where LBIST controller 20 provides this data to data bus $DB_1$ as described later. In addition, LBIST controller 20 also outputs a 4-bit control signal referred to herein as MUX_CONTROL, where this signal is coupled to a control bus CB which includes four control conductors to connect each of the four bits of MUX_CONTROL to a respective one of the control inputs of multiplexers M1 through M4. Given these connections, and according to a preferred methodology detailed later, LBIST controller 20 asserts MUX_CONTROL to different states, thereby controlling multiplexers M1 through M4 such that at certain times all multiplexers M1 through M4 pass the data from XOR gates block 16 to the scan channels, while at other times all multiplexers M1 through M4 pass the data from data bus $DB_1$ to the scan channels. Indeed, due to this preferred approach, note that control bus CB could alternatively be a one conductor bus which presented the same state to each of multiplexers M1 through M4, thereby causing each to operate in a same manner as the others.

With respect to the data output from scan core 12, in addition to connecting to MISR block 18 note that each scan channel output is further connected to a data bus $DB_2$. Data bus $DB_2$ is connected to LBIST controller 20. Thus, and for reasons detailed below, the data output by scan core 12 is available for processing by LBIST controller 20, when desired.

Figure 2:
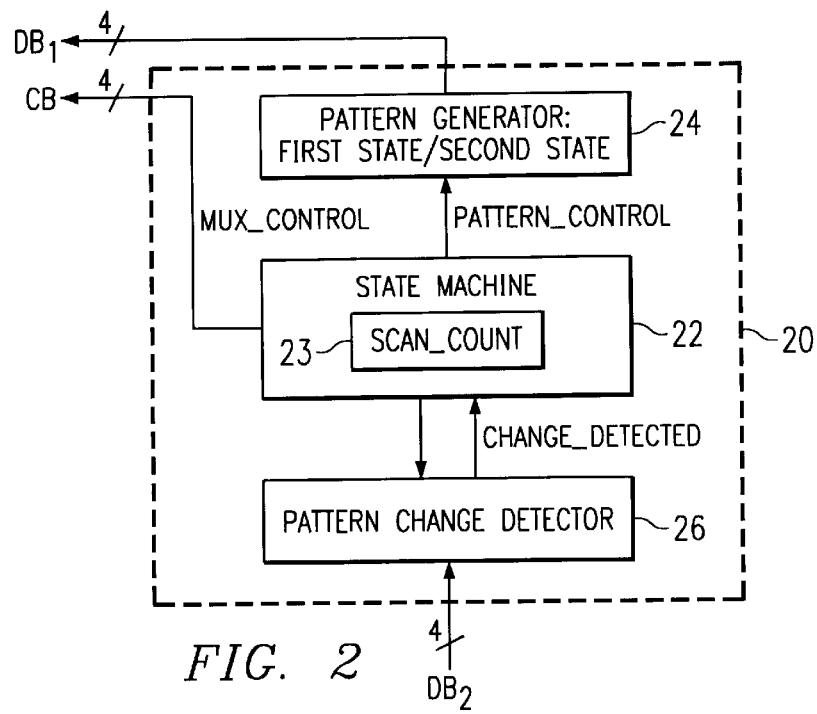
FIG. 2 illustrates a block diagram of the LBIST controller 20 of FIG. 1 insofar as blocks are implemented for achieving the methodology of the preferred embodiment.

FIG. 2 illustrates a block diagram of LBIST controller 20 of FIG. 1, but it should be noted that the blocks of FIG. 2 are only those relating to implement the methodology of the preferred embodiment. Thus, LBIST controller 20 may include numerous other aspects, such as the control features required to provide the control signals to PRPG block 14 and MISR block 18 as those connections are shown in FIG. 1. Nevertheless, to simplify the illustration and the remaining discussion, such additional aspects are neither illustrated nor described. Also by way of introduction, note that FIG. 3 below describes the preferred operation of the blocks of FIG. 2, and from this discussion, one skilled in the art may ascertain numerous alternatives for implementing each such block. Further in this regard, the blocks are shown only as logical illustrations of the functionality and, therefore, the actual hardware/software implementing such functionality may be such that the blocks are combined or further subdivided based on a given implementation.

Looking to the blocks shown in FIG. 2, LBIST controller 20 includes a state machine 22 which generally controls the method flow as detailed below in connection with FIG. 3. Further, state machine 22 includes a counter 23 which is shown to monitor a count referred to herein as SCAN_

COUNT. As detailed below, ultimately SCAN_COUNT identifies the length of the longest scan channel in scan core 12, as is the goal of the preferred embodiment. State machine 22 provides as one output the MUX_CONTROL signals to control bus CB which, as described earlier, controls multiplexers M1 through M4 so that either data from XOR gates block 16 or data from data bus $DB_1$ is coupled to the scan channels. State machine 22 has a second output coupled to provide a PATTERN_CONTROL signal to a pattern generator block 24, as further detailed below.

Pattern generator block 24 operates to output one of two different patterns of bits to the N (e.g., N=4) lines of data base $DB_1$. In the preferred embodiment, a first of the two patterns is all bits in a first logical state (e.g., all binary zeroes), while the second of the two patterns is all bits in a second logical state complementary to the first logical state (e.g., all binary ones). Lastly, the selection of which of the two patterns is output to data bus $DB_1$ is in response to the PATTERN_CONTROL signal received by pattern generator block 24 from state machine 22.

LBIST controller 20 further includes a pattern change detector block 26 which receives the bits output by the scan channels as connected to data bus $DB_2$. As detailed below, pattern change detector block 26 examines these bits to detect a particular type of change in the received bits. Once this change is detected, pattern change detector block 26 asserts a signal CHANGE_DETECTED to state machine 22, which furthers the preferred methodology as detailed below. The particular type of pattern detection implemented by block 26 is also described below, and in view of that discussion also is provided a discussion of a preferred circuit implementation to detect such a pattern.

Figure 3:
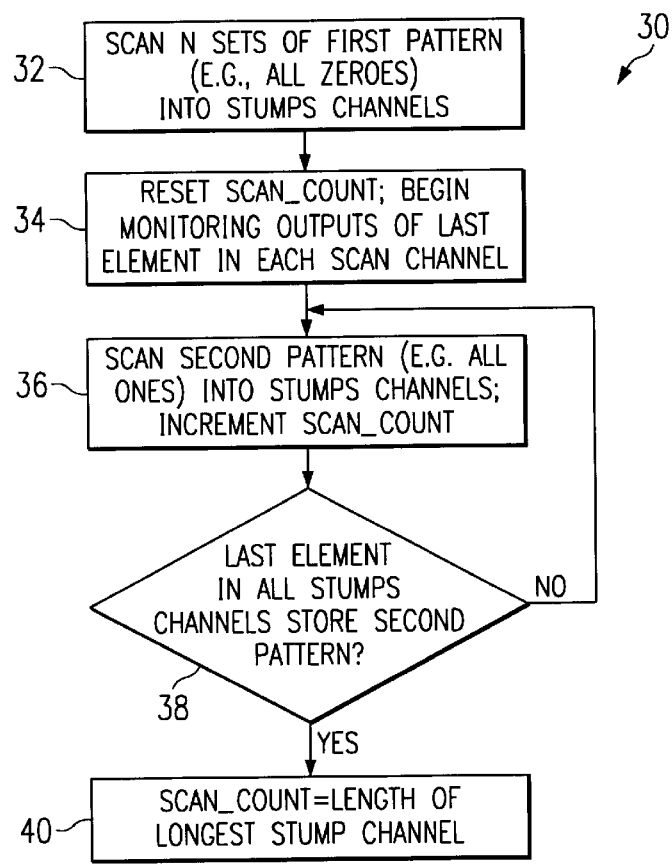
FIG. 3 illustrates a flow chart of the preferred methodology of LBIST controller 20 of FIG. 2 for determining the length of the longest STUMPS scan channel in scan core 12.

FIG. 3 illustrates a flow chart of a preferred method 30 of operation of LBIST. controller 20 for determining the length of the longest STUMPS scan channel in scan core 12 of integrated circuit 10. The flow of method 30 is generally controlled by state machine 22, with additional functionality from the other blocks in FIG. 2 as will be apparent from the remaining discussion. Method 30 begins with a step 32, where state machine 22 asserts PATTERN_CONTROL in a first state to pattern generator block 24. In response to the PATTERN_CONTROL signal, pattern generator block 24 begins outputting its first of two patterns of bits, and assume by way of example that this pattern consists of all binary zeroes. These zeroes are therefore connected to data bus $DB_1$. At the same time, state machine 22 asserts the MUX_CONTROL signal to a first state so that each of multiplexers M1 through M4 connects the zeroes from data bus $DB_1$ to the inputs of scan channels SC1 through SC4. From the preceding, it should be appreciated that a pattern of all binary zeroes is shifted into the first element of each of scan paths SC1 through SC4 (i.e., into elements $EC1_1$, $EC2_1$, $EC3_1$, and $EC4_1$, respectively). In addition, during step 32 state machine 22 maintains the same control for an integer number N clock cycles, so that an integer number N instances of the first pattern are connected to the scan channels, thereby causing each previous instance of the first pattern to shift in the direction of a successive element in each scan channel. In the preferred embodiment, the integer number N is selected to be a number sufficiently larger than what could be realistically anticipated as the length of the longest scan channel. For example, recall it was mentioned earlier that scan channels typically consist of one to several hundred elements. Accordingly, given those numbers, N is preferably set to a greater number and, thus, by way of example assume that N equals 1,000. Accordingly, by the completion of step 32, then for 1,000 clock cycles, a pattern of all zeroes is shifted through the elements of all of the scan channels in scan core 12. Moreover, because N is sufficiently larger than the longest scan channel in scan core 12, then by the completion of step 32 all elements in all of the scan channels store a value of a binary zero. Next, method 30 continues to step 34.

In step 34 state machine 22 clears the value of SCAN_COUNT in counter 23. In addition, state machine 22 controls pattern change detector block 26 to begin evaluating the pattern received from data bus $DB_2$, that is, the pattern as output from all of scan channels SC1 through SC4. More particularly, and for reasons more clear below, pattern change detector block 26 begins evaluating the data on data bus $DB_2$ to detect when it presents a second pattern of bits differing from the first pattern loaded into the scan channels in step 32. In the preferred embodiment, the second pattern consists of bits that are complementary to the first pattern, although alternative approaches are contemplated as discussed later. In any event, for the present example where the first pattern loaded into the scan channels in step 32 was all binary zeroes, then pattern change detector block 26 begins to evaluate the data on data bus $DB_2$ to detect when that data presents a second pattern of all binary ones. In this regard, note that one logical circuit implementation to achieve this detection could be a multiple input logic AND gate (as formed using multiple AND gates), where the output of this gate provides the CHANGE_DETECTED signal to state machine 22. As known in the art, such a logic gate changes its output from a logic low to a logic high only once all inputs to the gate are logic highs. Thus, when pattern change detector block 26 detects that all outputs of scan channels SC1 through SC4 are high, the state of the CHANGE_DETECTED signal will transition and notify state machine 22 of the change. Still further, note that the use of an AND gate is only by way of a logical illustration, where a more practical implementation may involve the use of a logic NAND gate since the logic NAND gate may be constructed using fewer transistors than its AND gate counterpart.

In step 36, state machine 22 asserts PATTERN_CONTROL in a second state to pattern generator block 24. In response to the PATTERN_CONTROL signal, pattern generator block 24 begins outputting its second of two patterns of bits; as introduced above with respect to step 34, recall that in one embodiment the second pattern consists of bits complementary to the first pattern and, thus, given the current example this second pattern consists of all binary ones. These ones are therefore connected to data bus $DB_1$, and thus pass via multiplexers M1 through M4 to the first element of each of scan paths SC1 through SC4 (i.e., into elements $EC1_1$, through $EC4_1$, respectively). Also in step 36, state machine 22 increments the SCAN_COUNT value in counter 23 for this first set of binary ones connected to the scan channels. Given that at this point only one set of binary ones have been connected to the scan chains, then note that the value of SCAN_COUNT now equals one. Next, method 30 continues to step 38.

Step 38 represents the determination by pattern change detector 26 as to whether the output of the scan channels have all changed from the first pattern (e.g., binary zeroes) to the second pattern (e.g., binary ones). If this change has not occurred, then method 30 returns from step 38 to step 36; on the other hand, if the pattern change from binary zeroes to binary ones has changed, then method 30 continues from step 38 to step 40. Each of, these alternatives is discussed separately, below.

An example where method 38 returns the flow from step 38 to step 36 is illustrated by applying the present application of method 30 to the scan channels illustrated in FIG. 2. In this regard, note in each instance of step 38 that the data evaluated in step 38 is the data coupled to pattern change detector block 26, that is, the data values stored in the final element of each scan channel (i.e., elements $EC1_5$, $EC2_8$, $EC3_6$, and $EC4_4$). Further, because these elements earlier were loaded with binary zeroes (from step 32), and because only one set of binary ones has been shifted into elements $EC1_1$, $EC2_1$, $EC3_1$, and $EC4_1$, then the values in elements $EC1_5$, $EC2_8$, $EC3_6$, and $EC4_4$ all will still equal zero. As a result, the CHANGE_DETECTED signal will not at this point indicate that the pattern received by pattern change detector block 26 is all binary ones. As a result, the flow of method 30 returns to step 36.

When step 36 is reached a successive time, it performs the same operation as described earlier. However, to appreciate the result of this operation, the discussion continues of the example of the four scan channels in scan core 12 of FIG. 2. Specifically, at this point in the example, step 36 causes a second set of binary ones to be scanned into the first elements of scan channels SC1 through SC4, thereby shifting the pre-existing values in the scan channels. As a result, this second set of binary ones shifts the first set of binary ones (that was scanned into the first elements of the scan channels in the previous instance of step 36) so that they progress to the second element in each of the scan channels. At this point, therefore, both the first and second element in each of scan channels SC1 through SC4 store values of binary ones, while all other scan channel elements store binary zeroes. In addition, SCAN_COUNT is again incremented and, therefore, it now stores a value of two. As described earlier, once step 36 is complete, method 30 continues to step 38.

Step 38 operates as described earlier, where pattern change detector 26 determines whether the last element in each of the scan channels stores a value from the second pattern (e.g., a logic one). As stated in the previous paragraph, at the current point of the example, however, each of these last elements stores a value of a binary zero. Thus, the state of CHANGE_DETECTED does not change, and the method flow again returns to step 36.

From the above, one skilled in the art will appreciate for the present example that steps 36 and 38 will continue to repeat numerous more times. Further in this regard, note that once step 36 has occurred four times, then the value of SCAN_COUNT equals four. In addition, at that time, a binary one will have reached the last element in scan channel SC4, namely, element $EC4_4$. However, also at this time, the element at the end of scan channel SC1, the four elements at the end of scan channel SC2, and the last two elements at the end of scan channel SC3 will still store values of binary zero. As a result, when step 38 is reached following the fourth occurrence of step 36, pattern change detector block 26 will have three binary zero inputs and one binary one input, thereby not causing a change in CHANGE_DETECTED. Consequently, again the flow will return to step 36.

An appreciation of the preferred embodiment is further obtained by examining the fifth, sixth, and seventh occurrences of step 36 in the present example. When step 36 occurs a fifth time, all elements of scan channels SC1 and SC4 will store binary ones. However, the last three elements of scan channel SC2 (i.e., $EC2_6$, $EC2_7$, and $EC2_8$), and the last element of scan channel SC3 (i.e., $EC3_6$) will store binary zeroes. Thus, method 30 returns to step 36. When step 36 occurs a sixth time, all elements of scan channels SC1 and SC4 will continue to store binary ones, and at this point all elements of scan channel SC3 also will store binary ones. However, the last two elements of scan channel SC2 (i.e., $EC2_7$ and $EC2_8$) still store binary zeroes. Again, therefore, method 30 returns to step 36 for a seventh occurrence of that step, which will result in a binary one reaching the next-to-last element of scan channel SC2, and once more method 30 returns to step 36 for an eighth occurrence of that step.

The eighth occurrence of step 36 will again present a set of binary ones to the inputs of all scan channels, and given the preceding states of those elements it should be appreciated that this eighth occurrence will result in a binary one reaching the last element of scan channel SC2, namely, element $EC2_8$. Further, the preceding occurrences of step 36 have caused the elements of all other scan channels SC1, SC3, and SC4 also to store binary ones. At this point, therefore, all four outputs of scan core 12 present values of binary one to data bus $DB_2$ and, hence, to pattern change detector block 26. Next, method 30 continues once more to step 38.

When step 38 is reached in the present example and following eight occurrences of step 36, the value of SCAN_COUNT equals eight and data bus $DB_2$ presents all binary ones to pattern change detector 26. In response to the complete set of binary ones, pattern change detector block 26 detects that the second pattern has been detected. Recall that this detection occurs in the present example due to the logic AND operation which, in response to the all logic high inputs, causes a positive transition in the CHANGE_DETECTED signal. This signal transition thereby indicates that as of this time all of the last elements in the scan channels are outputting the second pattern and, thus, method 30 continues to step 40.

Step 40 represents the completion of method 30. At this point, the value of SCAN_COUNT equals the length of the longest scan channel in scan core 12. Thus, by step 40, note that method 30 has electronically determined the length of the longest scan channel. As a result, the value may be used in various fashions as desirable by one skilled in the art. For example, this value is required for additional BIST operations, and indeed is used in the preferred embodiment to define the number of times that scan test data is shifted through successive elements in scan core 12 during the scan mode, that is, the number of shifts starting with the first shift in of the scan test pattern into the first scan element in each channel and then continuing with the successive shifts through successive elements of the scan channels. Additional uses of the length of the longest scan channel may be ascertained by one skilled in the art. In any event, it should be appreciated by step 40 that the length of the longest scan channel has been automatically determined without requiring it to be hard coded into LBIST controller 22, or otherwise provided in a fixed form to that device. Finally, although not shown in FIG. 3, note that once the longest scan channel in scan core 12 has been determined and it is desirable to perform LBIST operations, then MUX_CONTROL is switched to a second state so that multiplexers M1 through M4 pass data from XOR gates block 16 to scan core 12.

From the above, it may be appreciated that the above embodiments provide an improved circuit system and methodology whereby an integrated circuit may automatically determine the longest channel in its scan core. Such an approach has numerous advantages, particularly when contrasted with the drawbacks of the prior art approach to hard coding this length parameter into the integrated circuit. As one advantage, note that as an integrated circuit design is being modified, the present system may be incorporated early in the design of the device without the need to later re-design or alter the design based on a pre-existing hard coded length parameter. As another advantage, method 30 may be employed in different LBIST controllers for different circuit designs without requiring any modification based on the different maximum length scan channel in those designs. Still other advantages will be ascertainable by one skilled in the art. Indeed, yet another advantage is that while the present embodiments have been described in detail, various substitutions, modifications or alterations could be made to the descriptions set forth above without departing from the inventive scope. For example, while method 30 has shown various separate steps, some of these steps may be combined or further divided into additional sub-steps. As another example, while the preceding example presents an instance where the first pattern used in step 32 is all zeroes and the second pattern used in step 36 (and repeated occurrences of step 36) is all ones, these patterns could be swapped with one another whereby step 32 uses a pattern of all ones and step 36 uses a pattern of all zeroes. In this latter case, of course, the particular circuitry to detect the latter pattern in pattern change detector block 26 would require modification as may be ascertained by one skilled in the art. As still another example, while the preferred embodiment uses a first and second pattern that are all the same binary state, a more complex implementation may involve using other patterns, and requiring a more complex detection circuit to determine a time when the second pattern has completely passed through all of the scan channels in scan core 12. As still another example, various changes may be made to the circuits shown for achieving the BIST operations—for instance, a different type of pattern generator may be used in lieu of PRPG block 14 and/or a different type of response analysis circuit could be used in lieu of MISR 18. Thus, these and other examples further illustrate the inventive scope, which is defined by the following claims.

What is claimed is:

1. An integrated circuit, comprising:
   combinational circuitry;
   a plurality of scan channels;
     wherein each of the plurality of scan channels comprises a number of scan elements;
     wherein for any of the plurality of scan channels having a number of scan elements greater than one element, the scan channel comprises a first element in the scan channel and a last element in the scan channel;
     wherein for any of the plurality of scan channels having a number of scan elements equal to one element, the one element is both a first element and a last element in the scan channel; and
     wherein selected ones of the scan elements are coupled to affect operation of the combinational circuitry;
   circuitry for coupling a predetermined pattern into the first element of each of the plurality of scan channels; and
   circuitry for determining, in response to circuitry for detecting, the number of scan elements in a longest of the plurality of scan channels.

2. The integrated circuit of claim 1 and further comprising circuitry for setting all values in all elements of each of the plurality of scan channels to a predetermined state prior to operation of the circuitry for coupling a predetermined pattern into a first element of each of the plurality of scan channels.

3. The integrated circuit of claim 2:
   wherein the predetermined state comprises a first binary state; and
   wherein the predetermined pattern comprises a second binary state complementary of the first binary state.

4. The integrated circuit of claim 3:
   wherein the predetermined state comprises a binary zero; and
   wherein the predetermined pattern comprises a binary one.

5. The integrated circuit of claim 4 wherein the circuitry for detecting comprises circuitry for performing a logical AND operation on values output by the last scan element in each of the plurality of scan channels.

6. The integrated circuit of claim 5 and further comprising:
   a pattern generator for generating a pattern of bits; and
   a response analysis circuit coupled to receive a bit state from each of the last elements of the scan channels.

7. The integrated circuit of claim 6:
   wherein the pattern generator comprises a pseudo random pattern generator for generating a pseudo random pattern of bits: and further comprising:
     a gate circuit coupled to the pseudo random pattern generator and for decorrelating the pseudo random pattern of bits to provide an output set of testing bits; and
     circuitry for coupling the output set of testing bits to respective ones of the first elements of the scan channel during a testing mode.

8. The integrated circuit of claim 7 wherein the circuitry for coupling the output set of testing bits to respective ones of the first elements of the scan channels during a testing mode is responsive to the determined number of scan elements in a longest of the plurality of scan channels.

9. The integrated circuit of claim 6 wherein the response analysis circuit comprises a multiple input signature register.

10. The integrated circuit of claim 3 and further comprising:
    a pattern generator for generating a pattern of bits; and
    a response analysis circuit coupled to receive a bit state from each of the last elements of the scan channels.

11. The integrated circuit of claim 10:
    wherein the pattern generator comprises a pseudo random pattern generator for generating a pseudo random pattern of bits;
    and further comprising:
      a gate circuit coupled to the pseudo random pattern generator and for decorrelating the pseudo random pattern of bits to provide an output set of testing bits; and
      circuitry for coupling the output set of testing bits to respective ones of the first elements of the scan channels during a testing mode.

12. The integrated circuit of claim 10 wherein the response analysis circuit comprises a multiple input signature register.

13. The integrated circuit of claim 1:
    and further comprising circuitry for setting all values in all elements of each of the plurality of scan channels to a predetermined state prior to operation of the circuitry for coupling a predetermined pattern into a first element of each of the plurality of scan channels;
    wherein the number of scan elements in the longest of the plurality of scan channels consists of an estimated integer number M of scan elements;
    wherein the circuitry for setting all values comprises circuitry for scanning the predetermined state into the first elements of the scan channels an integer X number of successive times; and wherein X exceeds M.

14. The integrated circuit of claim 13:

wherein the predetermined state comprises a binary zero; and wherein the predetermined pattern comprises a binary one.

15. The integrated circuit of claim 14 wherein the circuitry for detecting comprises circuitry for performing a logical AND operation on values output by the last scan element in each of the plurality of scan channels.

16. The integrated circuit of claim 15 and further comprising:

a pattern generator for generating a pattern of bits; and a response analysis circuit coupled to receive a bit state from each of the last elements of the scan channels.

17. The integrated circuit of claim 16:

wherein the pattern generator comprises a pseudo random pattern generator for generating a pseudo random pattern of bits; and further comprising:

a gate circuit coupled to the pseudo random pattern generator and for decorrelating the pseudo random pattern of bits to provide an output set of testing bits; and circuitry for coupling the output set of testing bits to respective ones of the first elements of the scan channels during a testing mode.

18. The integrated circuit of claim 16 wherein the response analysis circuit comprises a multiple input signature register.

19. The integrated circuit of claim 1 wherein selected ones of the scan elements are coupled to affect operation of circuitry in addition to the combinational circuitry.

20. A method of operating an integrated circuit having a plurality of scan channels, wherein each of the plurality of scan channels comprises a number of scan elements, comprising the steps of:

coupling a predetermined pattern into a first element of each of the plurality of scan channels;

wherein for any of the plurality of scan channels having a number of scan elements greater than one element, the one element is both the first element and a last element in the scan channel;

wherein for any of the plurality of scan channels having a number of scan elements equal to one element, the one element is both the first element and a last element in the scan channel;

detecting the predetermined pattern in the last element of each of the plurality scan channels; and determining, in response to the detecting step, the number of scan elements in a longest of the plurality of scan channels.

21. The method of claim 20 and further comprising the step of setting all values in the first element of each of the plurality of scan channels to a predetermined state prior to the step of coupling a predetermined pattern into a first element of each of the plurality of scan channels.

22. The method of claim 21 and further comprising the step of, responsive to the determined number of scan elements in a longest of the plurality of scan channels, coupling an output set of testing bits to respective ones of the first elements of the scan channels during a testing mode.

23. The method of claim 22 and further comprising the step of, responsive to the determined number of scan elements in a longest of the plurality of scan channels equaling an integer number N, coupling N times an output set of testing bits to respective ones of the first elements of the scan channels during a scan mode.

\* \* \* \* \*